United States Patent [19]

Weisfield et al.

[11] Patent Number: 5,648,674

[45] Date of Patent: Jul. 15, 1997

[54] ARRAY CIRCUITRY WITH CONDUCTIVE LINES, CONTACT LEADS, AND STORAGE CAPACITOR ELECTRODE ALL FORMED IN LAYER THAT INCLUDES HIGHLY CONDUCTIVE METAL

[75] Inventors: Richard L. Weisfield, Los Altos; Nizar S. Kheraj, San Jose; Mai T. Nguyen, Palo Alto, all of Calif.

[73] Assignee: Xerox Corporation, Stamford, Conn.

[21] Appl. No.: 474,845

[22] Filed: Jun. 7, 1995

[51] Int. Cl.⁶ .................... H01L 31/119; H01L 31/0224; G01T 1/24
[52] U.S. Cl. .................. 257/428; 257/59; 257/72; 257/448; 250/370.09; 250/370.14
[58] Field of Search .............................. 257/59, 72, 444, 257/448, 428; 250/370.14, 370.09

[56] References Cited

U.S. PATENT DOCUMENTS

| | | | |
|---|---|---|---|
| 4,770,965 | 9/1988 | Fender et al. | 430/66 |
| 5,182,620 | 1/1993 | Shimada et al. | 257/72 |
| 5,319,206 | 6/1994 | Lee et al. | 250/370.09 |
| 5,320,927 | 6/1994 | Fender et al. | 430/128 |
| 5,360,994 | 11/1994 | Wolters et al. | 257/764 |
| 5,381,014 | 1/1995 | Jeromin et al. | 250/370.09 |
| 5,396,072 | 3/1995 | Schiebel et al. | 250/370.09 |
| 5,475,246 | 12/1995 | Wei et al. | 257/72 |
| 5,498,573 | 3/1996 | Whetten | 257/59 |
| 5,516,712 | 5/1996 | Wei et al. | 437/40 |
| 5,518,805 | 5/1996 | Ho et al. | 428/213 |
| 5,557,534 | 9/1996 | Wu | 364/491 |

OTHER PUBLICATIONS

U.S. Patent Application No. 08/235,008 entitled "Thin–Film Structure with Conductive Molybdenum–Chromium Line", filed on Apr. 28, 1994.

U.S. Patent Application No. 08/235,009 entitled "Electronically Isolated Pixel Element in a Low Voltage Activated Active Matrix Liquid Crystal Display and Method", filed on Apr. 28, 1994.

U.S. Patent Application No. 08/423,906 entitled "Sensor Element Array Having Overlapping Detection Zones", filed on Jun. 7, 1995.

U.S. Patent Application No. 08/367,984 entitled "Circuitry With Gate Line Crossing Semiconductor Line at Two or More Channels", filed on Jan. 3, 1995.

U.S. Patent Application No. 08/455,888 entitled "An Integrated Dark Matrix For An Active Liquid Crystal Display and Manufacturing Method", filed on May 31, 1995.

U.S. Patent Application No. 08/453,732 entitled "Active Matrix Liquid Crystal Device and Manufacturing Method", filed on May 30, 1995.

U.S. Patent Application No. 08/483,406 entitled "Improved Solid State Sensor Array", filed on Jun. 7, 1995.

U.S. Patent Application No. 08/483,404 entitled "Separately Etching Insulating Layer For Contacts Within Array and for Peripheral Pads", filed on Jun. 7, 1995.

U.S. Patent Application No. 08/688,976 entitled "Dual Dielectric Capping Layers for Hillock Suppression in Metal Layers in Thin Film Structures", Filed on Jul. 31, 1996.

(List continued on next page.)

Primary Examiner—Jerome Jackson

[57] ABSTRACT

A product such as an x-ray sensor array includes, for each unit of cell circuitry, a capacitor with upper and lower electrodes. A conductive layer that includes highly conductive metal such as aluminum is patterned to include the upper electrode of the capacitor, the contact leads of a switching element, and the data lines of the array. The upper electrode has an exposed area due to an opening in an insulating layer over it. A conductive element, such as an ITO island, is formed over the insulating layer, contacting the exposed area of the upper electrode so that the conductive element is electrically connected to one of the contact leads of the switching element through the upper electrode. The conductive elements of adjacent units can be separated by the minimum spacing necessary to ensure isolation. Or each unit's conductive element can be offset slightly from the data and scan lines and can also be pulled back from the channel of the switching element, which can be a TFT.

26 Claims, 5 Drawing Sheets

OTHER PUBLICATIONS

U.S. Patent Application No. 08/572,357 entitled "Array With Metal Scan Lines Controlling Semiconductor Gate Lines", filed on Dec. 14, 1995.

U.S. Patent Application No. 08/667,198 entitled "Sensor Array With Anticoupling Layer Between Data Lines and Charge Collection Electrodes", filed on Jun. 20, 1996.

U.S. Patent Application No. 08/667,202 entitled "Sensor Array Data Line Readout With Reduced Crosstalk", filed on Jun. 20, 1996.

Lee, D.L., Cheung, L.K., and Jeromin, L.S., "A New Digital Detector for Projection Radiography," in Van Metter, R.L. and Beutel, J., Eds., *Medical Imaging 1995: Physics of Medical Imaging*, Proc. SPIE vol. 2432, 26–27 Feb. 1995, pp. 237–249.

Kaneko, E., *Liquid Crystal TV Displays: Principles and Applications of Liquid Crystal Displays*, Tokyo: KTK Scientific Publishers, 1987, pp. 211–277.

ARRAY CIRCUITRY WITH CONDUCTIVE LINES, CONTACT LEADS, AND STORAGE CAPACITOR ELECTRODE ALL FORMED IN LAYER THAT INCLUDES HIGHLY CONDUCTIVE METAL

BACKGROUND OF THE INVENTION

The present invention relates to circuitry formed on a substrate.

Some conventional techniques form a conductive element, such as a layer of indium tin oxide (ITO), over a unit of cell circuitry in an array.

SUMMARY OF THE INVENTION

The invention addresses complexities that arise in forming circuitry on a substrate. More specifically, the invention addresses complexities that arise in forming an array of cells on a substrate, where each cell includes a storage capacitor that has one electrode connected to a conductive element that lies over the electrode.

The invention is further based on the discovery of a new structure that is simple and easy to produce. The new structure is useful for applications in which the cell circuitry need not be light transmissive; in which it is advantageous to maximize the area occupied by each cell's overlying conductive element; and in which it is also advantageous to maximize the area occupied by capacitor electrodes. Such applications include sensor arrays and reflective display arrays.

The new structure's simplicity and ease of production result from forming several different features in a single layer of highly conductive metal. The layer includes not only a set of conductive lines extending across the array, but also includes the contact leads of a switching element and the upper electrode of a capacitive element. One of the contact leads and the upper electrode are joined in the layer, and the upper electrode has an exposed part due to an opening in the insulating layer over it. Therefore, the overlying conductive element contacts the upper electrode in the exposed part, providing an electrical connection to the switching element.

The new structure can thus be implemented in array circuitry in which each unit of cell circuitry includes a switching element with a semiconductor channel between first and second contact leads of highly conductive metal; a capacitive element with a dielectric between first and second electrodes; and a conductive element. The first contact lead connects electrically to a conductive line, so that the channel provides an electrical connection between the second contact lead and the conductive line when the channel is conductive. The second contact lead connects electrically to the second electrode of the capacitive element, which in turn connects electrically to the conductive element.

The array includes several layers of material that form the cell circuitry. A first patterned conductive layer includes the first electrode of each unit of cell circuitry. A first insulating layer includes a capacitor dielectric that covers the first electrode. A second patterned conductive layer of highly conductive metal includes the conductive line, the first and second contact leads of the switching element, and the second electrode covering the capacitor dielectric. The second contact lead and the upper electrode are joined in the second patterned conductive layer. A second insulating layer extends over the upper electrode except an exposed part over which the second insulating layer has an opening. Finally, a third patterned conductive layer includes the conductive element, which also extends over the upper electrode. The conductive element covers the exposed part of the upper electrode, so that the conductive element is electrically connected to the second contact lead through the second electrode.

A product that includes the array can also have a transducer element along the conductive elements for receiving signals from or providing signals to the conductive lines through the cell circuitry. For example, an x-ray sensor can include an x-ray sensitive material such as selenium over the conductive elements so that each conductive element receives a quantity of charge carriers from a region of the material indicating intensity of x-ray radiation received by the region.

The new structure can be implemented with a wide variety of materials and integration techniques. One successful implementation uses an insulating substrate such as glass. The array circuitry is formed at one surface of the substrate.

The highly conductive metal can be aluminum, an alloy of aluminum, or another metal sufficiently conductive that signals can traverse the conductive lines within the switching period of the switching elements and that capacitance does not cause significant delay. In some applications with low switching speeds, less conductive metals such as an alloy of molybdenum and chromium or an alloy of indium tin oxide (ITO) can be employed.

The second patterned conductive layer can include an aluminum sublayer between protective sublayers of refractory metal, such as titanium, tungsten, molybdenum, chromium, or an alloy of such metals. The first patterned conductive layer can be similarly formed, and can include, in addition to the first electrode of each cell's circuitry, the scan lines and each cell's gate lead, joined within the layer.

The first insulating layer can include silicon nitride or another appropriate insulator. The channel can be formed in a layer of intrinsic amorphous silicon, and channel leads can be formed in a layer of heavily n-doped amorphous silicon.

The second insulating layer can be a layer of silicon oxynitride or another appropriate material. It can serve as a passivation layer, and can extend over the conductive lines and over the channel and contact leads of each unit of cell circuitry. For better step coverage, the edge of the second insulating layer around the opening can have a tapered profile.

The third patterned conductive layer can include any conductive material appropriate for the function of the conductive elements. ITO has been successfully employed, but any conductive metal or doped semiconductor material could be used that is sufficiently conductive to perform the required functions. For example, if the conductive element functions to receive charge carriers from a transducer or provide charge carriers to a transducer, the material must be sufficiently conductive to pass the required current to or from the transducer in the time available. Or if the conductive element functions as a capacitor electrode, the material must be sufficiently conductive to spread charge over its area in the time available. The choice of material for the conductive element may also depend on characteristics other than conductivity, such as its function as a protective layer to shield the channel, as a blocking layer for charge carrier injection, as a buffer layer to prevent interaction between adjacent layers, or as a light reflecting layer.

The product in which the invention is implemented can be a two-dimensional (2D) array, for example, with two sets of conductive lines extending in perpendicular directions. Each line extending in one direction, referred to as a data line, can provide signals to or receive signals from a column of the array; each line extending in another direction, referred to as a scan line, can provide signals to select a row of the array. The product can be an array with M scan lines and N data lines. For the mth scan line and the nth data line, the array can include (m×n)th cell circuitry near the crossing region where the nth data line crosses the mth scan line, the cell circuitry including a switching element, a capacitive element, and a conductive element as described above.

The conductive element of the (m×n)th cell circuitry can extend beyond the cell area bounded by the mth and (m+1)th scan lines and the nth and (n+1)th data lines, overlapping the mth scan line. The conductive element can be separated from the conductive element of an adjacent cell's circuitry by a spacing just sufficient for isolation. The second insulating layer can be sufficiently thick that coupling between the conductive element and the scan line does not significantly slow propagation of signals on the scan and data lines. Alternatively, the conductive element can be offset from the edges of the scan lines and data lines sufficiently to avoid introducing noise due to charge carrier injection or crosstalk.

Each unit's conductive element can also cover the contact leads and channel, to protect the unit's switching element from back channel formation. Alternatively, the conductive element can cover only the second contact lead but not the channel or the first contact lead to avoid introducing noise from the scan line through a gate lead that extends under the channel or from the data line that is connected to the first contact lead.

The new structure described above is advantageous because it allows several features to be formed by patterning a single layer that includes highly conductive metal. As a result, the required number of process steps is reduced. In addition, the structure's simplicity makes it more robust than more complex structures.

In comparison with techniques in which a conductive element of ITO is the upper element of a capacitor, the new structure described above provides a larger charge sensing area and a higher fill factor. The area of the capacitor is only about 50% or less of the area of a unit of circuitry, but the new structure described above has been successfully used to obtain an 86% fill factor. With the new structure, the fill factor attainable is limited only by the minimum spacing necessary for isolation between conductive elements.

When extended over the contact leads and channel as described above, the conductive element shields the channel from high voltage and reduces the amount of charge built up on the surface of a unit of cell circuitry in an array.

The following description, the drawings, and the claims further set forth these and other aspects, objects, features, and advantages of the invention.

DETAILED DESCRIPTION

A. Conceptual Framework

The following conceptual framework is helpful in understanding the broad scope of the invention, and the terms defined below have the indicated meanings throughout this application, including the claims.

"Circuitry" or a "circuit" is any physical arrangement of matter that can respond to a first signal received at one location or time by providing a second signal at another location or time, where the timing or content of the second signal provides information about timing or content of the first signal. Circuitry "transfers" a first signal when it receives the first signal at a first location and, in response, provides the second signal at a second location.

Any two components are "connected" when there is a combination of circuitry that can transfer signals from one of the components to the other. For example, two components are "connected" by any combination of connections between them that permits transfer of signals from one of the components to the other. Two components are "electrically connected" when there is a combination of circuitry that can transfer electric signals from one to the other. Two components could be electrically connected even though they are not physically connected, such as through a capacitive coupling.

A "substrate" is a unit of material that has a surface at which circuitry can be formed or mounted. An "insulating substrate" is a substrate through which no electric current can flow.

A "layer" is a thickness of material formed over a surface and extending generally parallel to the surface, with one side toward the surface and another side away from the surface. A layer may include two or more layers within it, referred to as "sublayers." A layer may be homogeneous or its composition may vary.

To "etch" is to remove parts of one or more layers of material.

An "etchant" is a fluid used to etch.

To perform "physical vapor deposition" is to cause a material to be deposited on a physical structure without a chemical reaction. Examples include sputtering, vacuum evaporation, and e-beam deposition.

To perform "chemical vapor deposition" is to cause a material to be deposited on a physical structure by use of reactant gases and an energy source to produce a gas-phase chemical reaction. The energy source could be thermal, optical, or plasma in nature; "plasma enhanced chemical vapor deposition" uses a plasma energy source.

An operation "deposits" a layer by depositing material to form the layer, such as by physical or chemical vapor deposition.

To perform "lithography" is to use a radiation source to transfer a mask pattern to a layer of radiation-sensitive material and then to develop the radiation-sensitive material to obtain a positive or negative copy of the mask pattern. The transferred pattern that results from development may be referred to as a "pattern of mask material" if it is to be used for etching.

An "electric circuit" is a circuit within which components are electrically connected. An "electric structure" is a physical structure that includes one or more electric circuits.

A "thin-film structure" is an electric structure that is formed at a surface of an insulating substrate. A thin-film structure could be formed, for example, by deposition and patterned etching of films on the insulating substrate's surface.

During production of an electric structure at a surface, a part of a first layer "covers" or "has a shape that covers" or "is over" a part of a second layer if the part of the second layer is between the part of the first layer and the surface. Similarly, a part of a first layer "extends across" a part of a second layer if the part of the first layer covers the part of the second layer.

An "exposed part" of a first layer that is elsewhere covered by a second layer is a part of the first layer that is not covered by the second layer. A third layer that covers the second layer may "contact" the exposed part of the first layer.

An operation "forms" a patterned layer or circuitry in a layer by a sequence of one or more operations that produce a layer that, rather than covering the entire substrate, forms a pattern. For example, the operation could deposit a layer, use lithographic techniques to form a mask, and etch away parts of the layer not covered by the mask to form a pattern.

An "integrated circuit" is a circuit formed at a substrate's surface by batch processes such as deposition, lithography, etching, oxidation, diffusion, implantation, annealing, and so forth.

A "lead" is a part of a component at which the component is electrically connected to other components. A "line" is a simple component that extends between and electrically connects two or more leads. A line is "connected between" the components or leads it electrically connects. A lead of a component is "connected" to a lead of another component when the two leads are electrically connected by a combination of leads and lines. In an integrated circuit, leads of two components may also be "connected" by being formed as a single lead that is part of both components.

The terms "array" and "cell" are related: An "array" is an article of manufacture that includes an arrangement of "cells." For example, a "two-dimensional array" or "2D array" includes an arrangement of cells in two dimensions. A 2D array of circuitry may include rows and columns, with a line for each row and a line for each column. Lines in one direction may be "data lines" through which a cell receives or provides signals that determine or indicate its state. Lines in the other direction may be "scan lines" through which a cell receives a signal enabling it to receive signals from or provide signals to its data line.

In an array of circuitry, "cell circuitry" is circuitry connected to a cell's scan line and data line.

A "crossing region" is a region in which two lines cross, such as a scan line and a data line.

A "conductive layer" is a layer formed of conductive material.

An "insulating layer" is a layer formed of a non-conductive material.

A part of a layer "has an edge" if another, complementary part of the layer has been removed by one or more processes, leaving the part of the layer. The edge is the boundary between part of a layer and its complementary part. A "width" of a part of a layer such as a line is a distance between two edges.

Edges of two layers or parts of layers in a thin-film structure are "approximately aligned" if their projections onto the surface of the substrate at which the thin-film structure is formed are approximately the same.

Edges of two layers or parts of layers are "slightly offset" from each other if their projections onto the surface of the substrate are at slightly different positions.

A component in one layer is "between" edges in another layer if the projection of the component onto the surface of the substrate is between the projections of the edges.

A "connected shape" in a thin-film structure formed at a surface of a substrate is a part of the structure that is formed from a layer and is bounded by an edge that extends between a first side toward the surface and a second side away from the surface. Parts of the connected shape are "joined."

A "channel" is a part of a component through which electric current can flow. A channel is "conductive" when the channel is in a state in which current can flow through it.

A "channel lead" is a lead that connects to a channel. A channel may, for example, extend between two channel leads.

A "charge carrier" is a real or fictitious particle that can transport charge through a channel to produce a current; electrons and holes are examples of charge carriers.

A process "implants" a dopant if the process causes particles of the dopant to enter a part of an integrated circuit.

A dopant "dopes" a part of a layer if the dopant is implanted in the part. A line is "doped" if it contains an implanted dopant.

An operation "forms" an electrical connection by producing an electrical structure through which current can flow between components.

A "switching element" is a component that includes a channel that extends between two channel leads and that can be controlled to switch between high impedance and low impedance.

A "transistor" is a switching element that has a channel that extends between two channel leads, and that also has a third lead—referred to as a "gate lead" or simply "gate"—such that the channel can be switched between high impedance and low impedance by signals that change potential difference between the gate and one of the channel leads, referred to as the "source." The channel lead that is not the source is referred to as the "drain." Other components may have leads called gates, sources, and drains by analogy to transistors.

A "thin-film transistor" or "TFT" is a transistor that is part of a thin film structure. A "capacitive element" is a component that stores a voltage level by storing charge. A capacitive element may include two conductive components, called "electrodes," separated by an insulating layer, sometimes called a "dielectric."

A conductive layer, a conductive line, or another component includes a "highly conductive metal" when the layer, line, or component includes a metal that is sufficiently conductive that signals can traverse the layer, line, or component within the switching period of related switching elements and without significant delay due to capacitance. Aluminum, certain alloys of aluminum, and certain other metals are highly conductive metals in nearly all contexts, while less conductive metals may be highly conductive at lower switching speeds.

B. General Features

Figure 1:
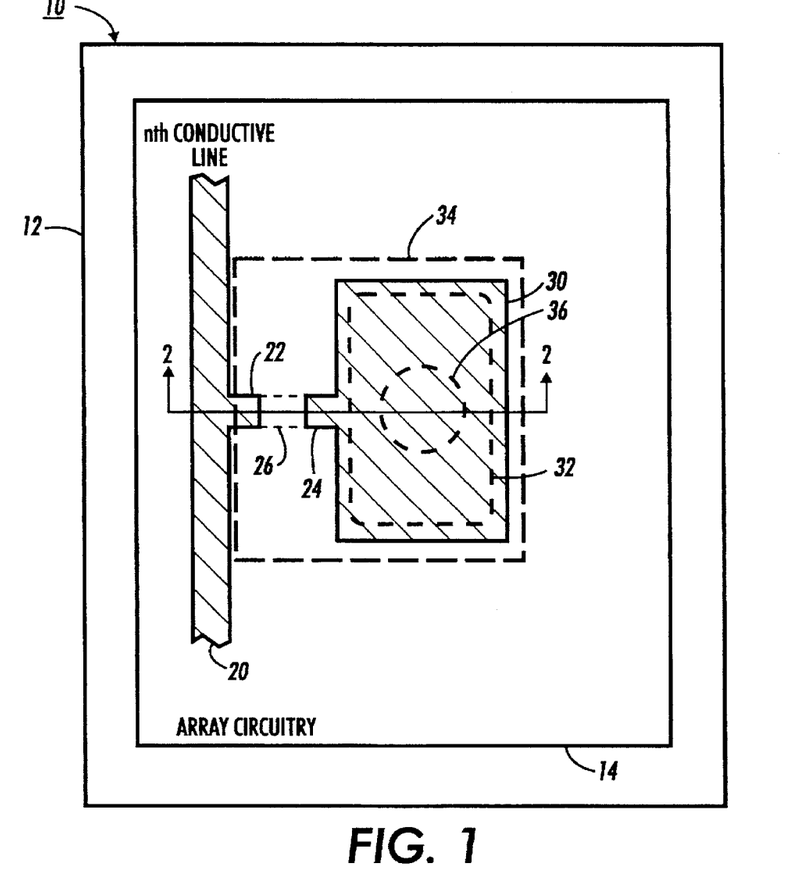
FIG. 1 is a schematic layout diagram showing a product, with an array in which a conductive line, first and second contact leads, and a capacitive electrode are all formed in a layer that includes a highly conductive metal.
Figure 2:
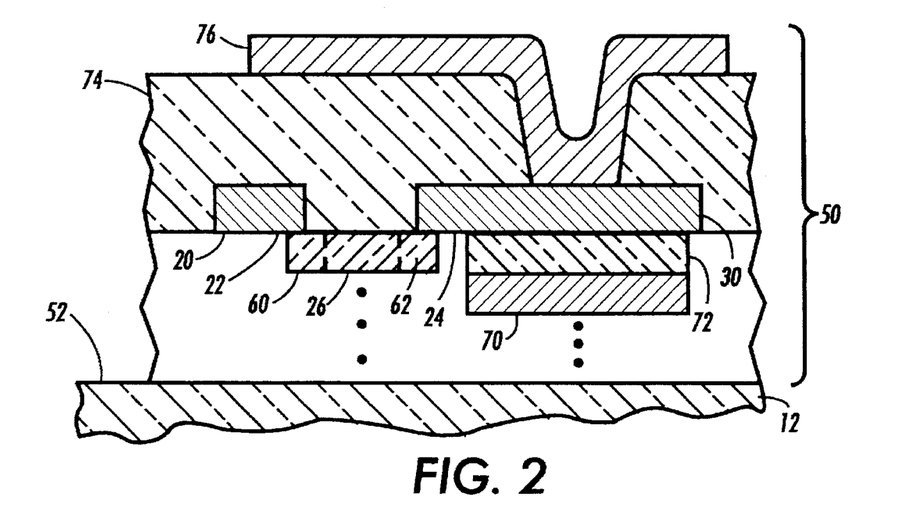
FIG. 2 is a schematic cross section along line 2—2 in FIG. 1.

FIGS. 1 and 2 show general features of the invention. FIG. 1 shows a product with array circuitry in which conductive lines, contact leads, and a capacitor electrode are all formed in a single layer that includes highly conductive metal. FIG. 2 shows a cross section of the circuitry in FIG. 1.

Product 10 in FIG. 1 includes substrate 12 with a surface at which array circuitry 14 is formed. Array circuitry 14 includes a patterned conductive layer shown by the cross-hatched areas in FIG. 1. The patterned conductive layer includes a highly conductive metal.

The patterned conductive layer includes N conductive lines extending across the surface of substrate 12, where N is greater than one. Array circuitry 14 includes units of cell circuitry along each of the N conductive lines, and FIG. 1 illustratively shows nth conductive line 20 together with some features of a unit of cell circuitry that are formed in the patterned conductive layer.

The cell circuitry shown in FIG. 1 includes first contact lead 22 and second contact lead 24. As indicated by the dashed lines between them, first contact lead 22 and second contact lead 24 are at opposite ends of channel 26. Channel 26 is in a layer that includes semiconductor material. When channel 26 is in its conductive state, second contact lead 24 is electrically connected to nth conductive line 20.

Second contact lead 24 joins and is therefore electrically connected to capacitor electrode 30, also in the patterned conductive layer. Dashed line 32 shows the outline of another capacitor electrode, formed in another patterned conductive layer and covered by a capacitor dielectric in an insulating layer and by capacitor electrode 30. Dashed line 34 shows the outline of a conductive element that is over capacitor electrode 30, separated from capacitor electrode 30 and other features in the same patterned conductive layer by another insulating layer. Dashed line 36 shows the edge around an opening in the insulating layer, through which the conductive element contacts capacitor electrode 30 so that the conductive element is electrically connected to second contact lead 24 through capacitor electrode 30.

FIG. 2 shows a cross-section of circuitry 50 at surface 52 of substrate 12, taken along the line labeled 2—2 in FIG. 1. For ease of representation, the cross-hatched features in FIG. 1 are all shown at a uniform level above surface 52, although the level of the features would ordinarily change depending on underlying layers.

Channel 26 is illustratively shown in a level below nth conductive line 20, first contact lead 22, and second contact lead 24, although channel 26 could be in a higher level. Channel 26 extends between first and second conductive channel leads 60 and 62, also in a semiconductive layer, and first and second channel conductive leads 60 and 62 are electrically connected to first and second contact leads 22 and 24, respectively.

Below capacitor electrode 30 is another capacitor electrode 70, and electrodes 30 and 70 are separated by capacitor dielectric 72, in an insulating layer. Another insulating layer 74 extends over conductive line 20, contact leads 22 and 24, channel 26, and capacitor electrode 30, except for an exposed part of capacitor electrode 30 over which an opening is defined in insulating layer 74. Conductive element 76 also extends over conductive line 20, contact leads 22 and 24, channel 26, and capacitor electrode 30. Because of the opening in insulating layer 74, conductive element 76 contacts capacitor electrode 30 and is electrically connected to second contact lead 24.

C. Implementation

The general features described above could be implemented in numerous ways in various products. The implementation described below is an x-ray sensor array.

C.1. Product

Figure 3:
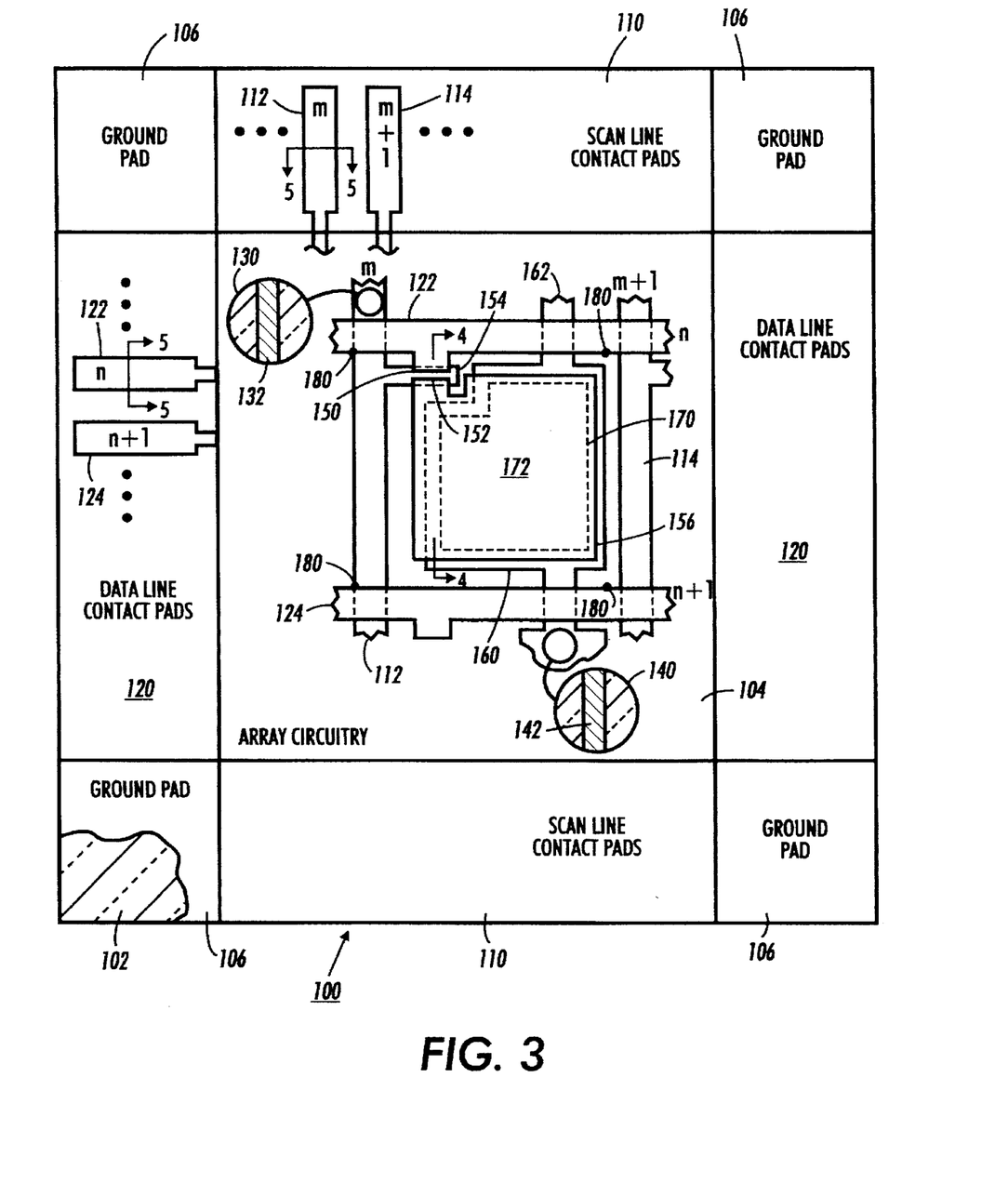
FIG. 3 is a schematic layout diagram of a product implementing features shown in FIGS. 1 and 2.
Figure 4:
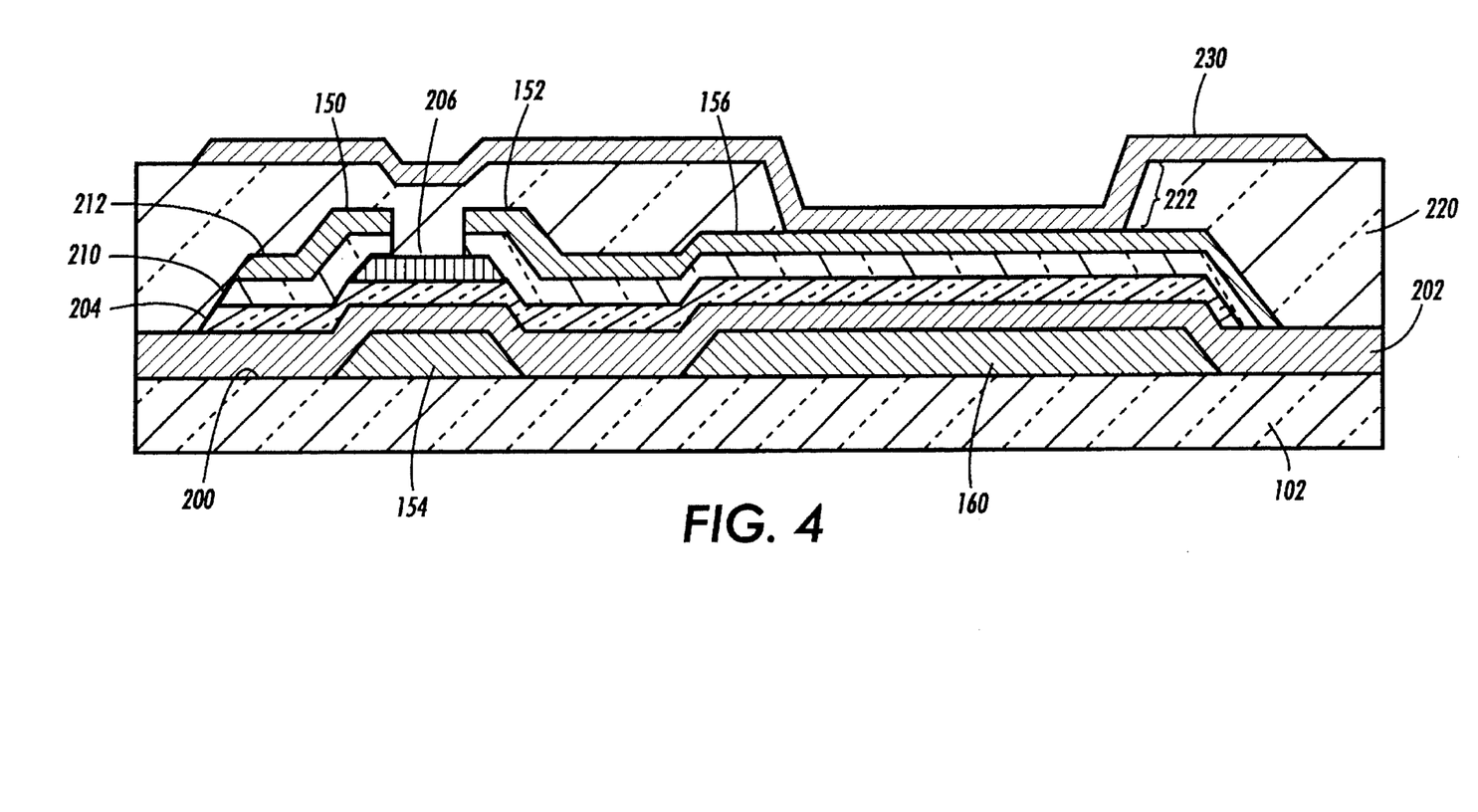
FIG. 4 is a cross-sectional view of the product of FIG. 3, taken along the line 4—4.
Figure 5:
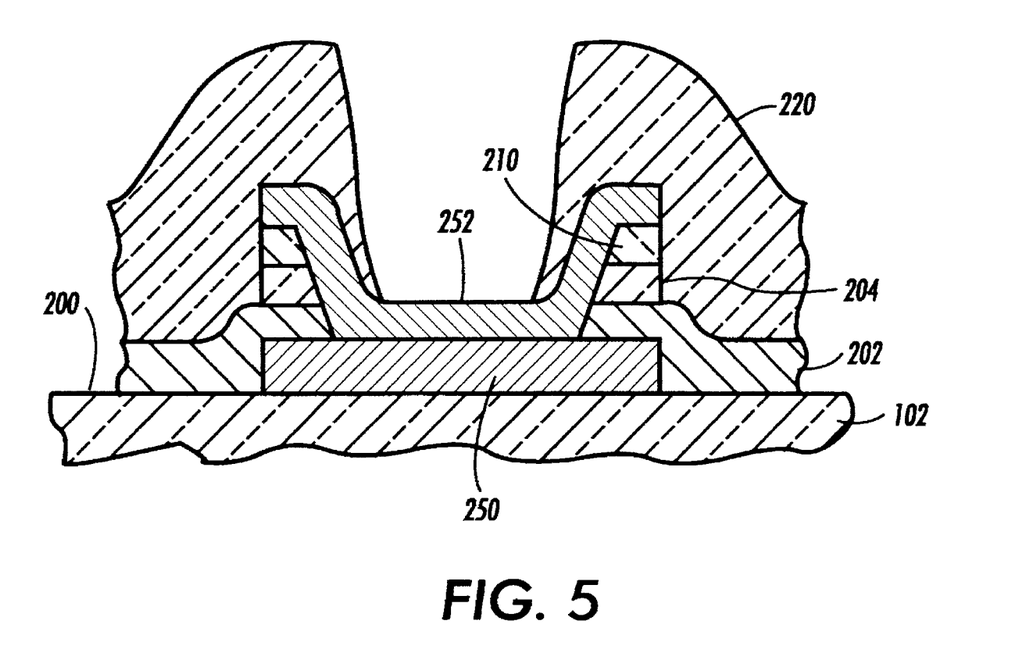
FIG. 5 is a cross-sectional view of the product of FIG. 3, taken along either of the lines 5—5.

FIGS. 3–5 show features of an x-ray sensor array product with a structure according to the invention. FIG. 3 shows layout of circuitry on a surface of the product's substrate. FIG. 4 shows a cross section along line 4—4 in FIG. 3. FIG. 5 shows a cross section along either of lines 5—5 in FIG. 3.

Product 100 in FIG. 3 includes substrate 102 with array circuitry 104 and with several kinds of peripheral circuitry, including ground pads 106, one at each corner of substrate 102. The peripheral circuitry also includes scan line contact pads 110 at the upper and lower sides of array circuitry 104, with FIG. 3 illustratively showing contact pads for mth scan line 112 and (m+1)th scan line 114 in more detail. The peripheral circuitry also includes data line contact pads 120 at the left and right sides of array circuitry 104, with FIG. 3 illustratively showing contact pads for nth data line 122 and (n+1)th data line 124 in more detail.

Cutaway 130 shows aluminum shunt 132 under scan line 112 providing a highly conductive path for scan signals across array circuitry 104. Cutaway 140 similarly shows aluminum shunt 142, providing a highly conductive connection for the lower electrode of the capacitor of each unit of cell circuitry to ground pads 106, which are held at a constant ground. voltage during operation. Contact leads 150 and 152 are formed in the same conductive layer as data lines 122 and 124, which can similarly include aluminum to provide highly conductive connections and signal paths. As shown, contact leads 150 and 152 each overlap gate lead 154, which joins gate line 112, so that a thin film transistor is formed in semiconductor layers between contact leads 150 and 152 and gate 154.

Contact lead 150 joins data line 122, while contact lead 152 joins upper electrode 156, which covers lower electrode 160. Lower electrode 160 joins capacitive line 162, which includes aluminum shunt 142, so that lower electrode 160 is held at ground. As shown, electrodes 156 and 160 are slightly offset from each other to ensure that capacitor area, and therefore capacitance, will not decrease significantly despite slight left-right or up-down alignment errors that may occur.

Dashed line 170 shows the boundary around exposed area 172 of electrode 156. A passivating layer over electrode 156 has an opening within dashed line 170. As shown, dashed line 170 can be parallel to the boundary of electrode 156, spaced from the boundary by about 10–15 μm.

The boundary around the area of the upper conductive element is shown in FIG. 3 by dots 180, each marking a corner of the conductive element. As shown, the conductive element contacts electrode 156 in the entirety of exposed area 172 and is therefore electrically connected to contact lead 152 through electrode 156. As suggested in FIG. 3, the size of exposed area 172 can vary, but a larger area may be better because it allows a more robust contact between electrode 156 and the conductive element. Therefore, it may be desirable to make exposed area 172 as large as possible.

As shown, the conductive element of each unit of cell circuitry overlaps scan line 112, aligns with but does not overlap data lines 122 and 124, and is spaced from scan line 114. This arrangement avoids introducing noise from scan line 114 and data lines 122 and 124 while allowing maximization of the conductive element's area. The area of the conductive element can be maximized by reducing the spacing between conductive elements of adjacent units to a spacing just sufficient to maintain isolation. A spacing of approximately 10 μm has been found sufficient for this purpose.

The cross section in FIG. 4 is taken along line 4—4 in FIG. 3. FIG. 4 shows layers at surface 200 of substrate 102.

A first conductive layer, a layer of titanium tungsten in the current implementation, includes gate lead 154 and lower electrode 160. In the illustrated cross section, this conductive layer does not include an aluminum shunt layer as illustrated in cutaways 130 and 140 in FIG. 3. The aluminum shunts run only within the scan lines and the capacitor lines.

Insulating layer 202, a bottom layer of silicon nitride, covers gate lead 154 and lower electrode 160 as well as other features formed in the same conductive layer, including scan lines and capacitor lines. Over insulating layer 202 is semiconductive layer 204, a layer of intrinsic amorphous silicon (a-Si) in which the TFT channel is formed. Over semiconductive layer 204 is insulating layer 206, a top layer of silicon nitride that forms an island over the channel in layer 204 and also forms an island (not shown) over the crossover region of each scan line in which a data line crosses over the scan line.

Over layers 204 and 206 is doped semiconductive layer 210, a layer of heavily n-doped a-Si that provides conductive channel leads at each end of the channel in layer 204. As shown, layers 204 and 210 both extend over electrode 160 in the current implementation.

Over layer 210 is conductive layer 212, which includes a highly conductive metal such as aluminum. In the current implementation, layer 212 includes a lower sublayer of titanium tungsten, a middle sublayer of aluminum, and an upper sublayer of titanium tungsten. As shown, contact leads 150 and 152 and upper electrode 156 are all formed in layer 212, together with data lines as shown in FIG. 3.

Over layer 212 is insulating layer 220, a layer of silicon oxynitride that acts as a passivation layer. Layer 220 has an opening formed in it to expose an area of upper electrode 156, and edge 222 around the opening has a tapered profile as shown.

Finally, conductive element 230 is formed in a conductive layer, contacting the exposed part of upper electrode 156. Conductive element 230 is currently implemented as a layer of ITO. Conductive element 230 extends over contact leads 150 and 152 and the channel in layer 204, and can also overlap its scan line as shown in FIG. 3. Insulating layer 220 can be sufficiently thick to prevent conductive element 230 from significantly slowing propagation of signals on the scan line it overlaps. The size of the opening in insulating layer 220 can also be adjusted to provide more space for tapering to ensure that conductive element 230 does not crack at edge 222.

FIG. 5 shows a cross section along either of lines 5—5 in FIG. 3. As suggested in FIG. 3, the cross sections of the contact pads of the scan lines and the data lines are substantially identical, so that they provide uniformly positioned surfaces for easier connection.

The first conductive layer of titanium tungsten forms lower contact pad 250. As shown, this layer does not include an aluminum shunt layer as illustrated in cutaways 130 and 140 in FIG. 3. The aluminum shunts run only within the scan lines and the capacitor lines, and do not extend under the contact pads.

Insulating layer 202 of silicon nitride, semiconductive layer 204 of a-Si, and doped semiconductive layer 210 of heavily n-doped a-Si have all been cut away by a first etch to expose most of contact pad 250. Layer 202 extends over the edges of lower contact pad 250.

Upper contact pad 252 is formed in conductive layer 212, with a lower sublayer of titanium tungsten, a middle sublayer of aluminum, and an upper sublayer of titanium tungsten as described above. The edges of lower contact pad 250 and upper contact pad 252 are approximately aligned, but alignment is not critical to formation of good contacts, as long as upper contact pad 252 covers the exposed part of lower contact pad 250. Layers 204 and 210 have been etched away except under upper contact pad 252.

Insulating layer 220 of silicon oxynitride has been cut away by a second etch to expose most of upper contact pad 252. The second etch is performed after the conductive layer of ITO has been patterned, so that the layer of ITO over insulating layer 220 has been removed in the area over upper contact pad 252.

C.2. Process

Figure 6:
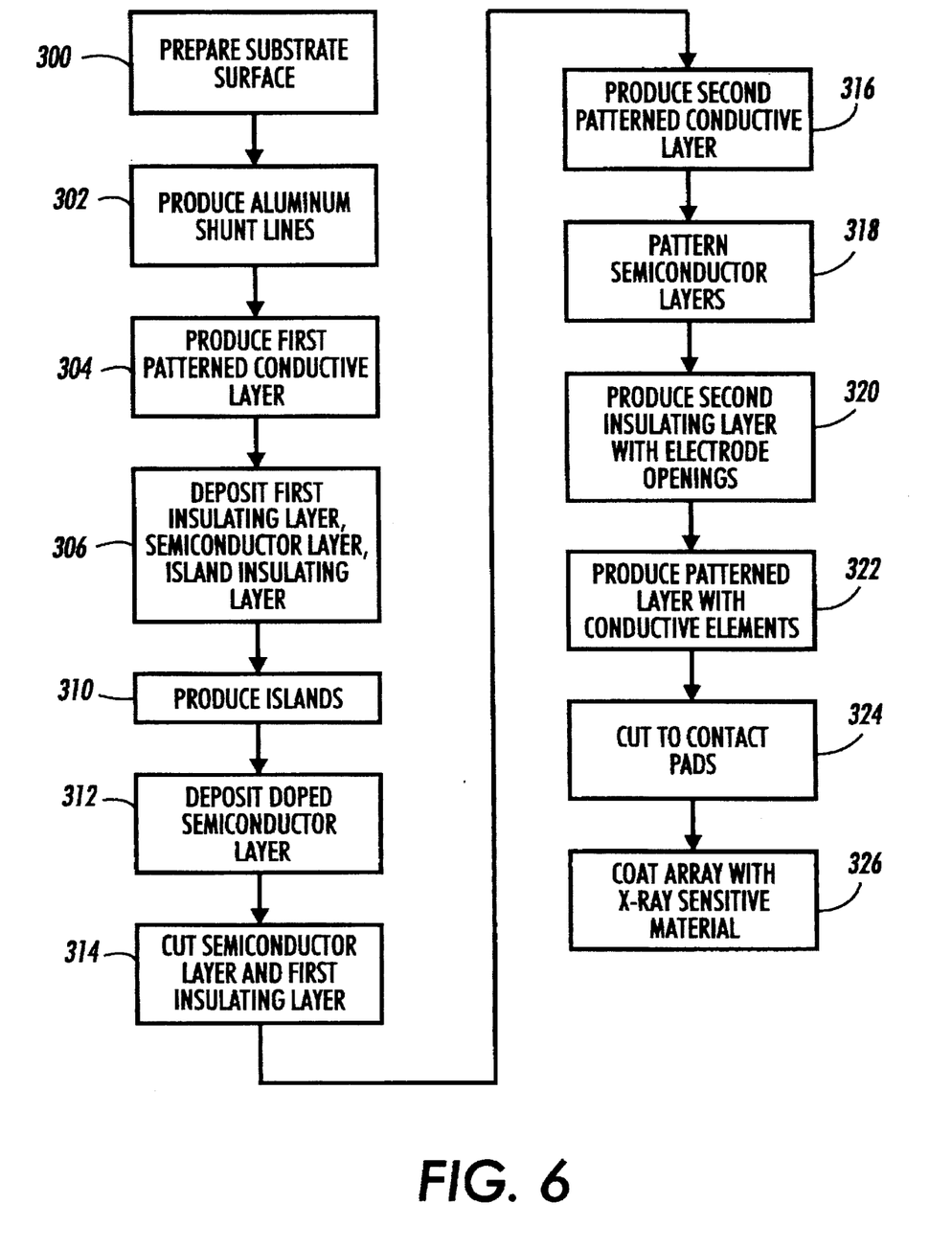
FIG. 6 is a flow chart showing a process that produces the product of FIG. 3.

FIG. 6 shows acts in producing a product as described above in relation to FIGS. 3–5. The process shown in FIG. 6 is very similar to that disclosed in copending, coassigned U.S. patent application Ser. No. 08/235,009, entitled "Electrically Isolated Pixel Element in a Low Voltage Activated Active Matrix Liquid Crystal Display and Method," incorporated herein by reference. Further information about the process is set forth in copending, coassigned U.S. patent application Ser. No. 08/483,404, entitled "Separately Etching Insulating Layer for Contacts Within Array and for Peripheral Pads," incorporated herein by reference.

The act in box 300 in FIG. 6 begins by preparing a surface of a glass substrate, such as Corning 7059 glass. The act in box 300 can include any necessary cleaning.

The act in box 302 then produces the aluminum shunts illustrated in cutaways 130 and 140 in FIG. 3. The act in box 302 can sputter deposit aluminum to a thickness of about 800 Å, then use photolithographic techniques to produce a mask and etch to obtain shunt lines approximately 8 μm wide.

The act in box 304 produces the first patterned conductive layer, with scan lines, gate lead 154, lower electrode 160, and lower contact pad 250. The act in box 304 can sputter deposit an alloy of titanium tungsten to a thickness of about 1200 Å, then use photolithographic techniques to produce a mask and etch to obtain scan lines approximately 14 μm wide and other features as laid out in FIG. 3.

The act in box 304 could alternatively use other techniques. For example, the first conductive layer could include sputter deposited MoCr, or a multilayered structure of alternating layers of Al and TiW, or Al with a dual dielectric capping layer, including low temperature deposited SiON and high temperature plasma enhanced chemical vapor deposited (PECVD) SiN. These techniques are discussed in greater detail in copending, coassigned U.S. patent application Ser. Nos. 08/235,008, entitled "Thin-Film Structure with Conductive Molybdenum-Chromium Line; 08/234, 897, now as U.S. Pat. No. 5,518,805 entitled "Hillock-Free Multilayer Metal Lines for High Performance Thin Film Structures; and 08/234,884, now continued as 08/512267 entitled "Dual Dielectric Capping Layers for Hillock Suppression in Metal Layers in Thin Film Structures", all of which are incorporated by reference.

The act in box 306 then produces first insulating layer 202, conductive semiconductive layer 204, and insulating layer 206 by a sequence of PECVD steps. First insulating layer 202 can be silicon nitride deposited at about 300°–380° C. to a thickness of about 3000 Å. Semiconductive layer 204 can be a layer of intrinsic a-Si that includes 5–12% hydrogen and is deposited at about 230°300° C. to a thickness of about 300–500 Å. Insulating layer 206 can be silicon nitride deposited primarily as an etch stop at 200°–250° C. to a thickness of about 1000–1500 Å.

The act in box 310 patterns insulating layer 206 to produce islands as described above in relation to FIG. 3. The act in box 310 can use photolithographic techniques to produce a self-aligned structure by first exposing a photoresist layer both from the bottom using the first conductive layer as a mask and from the top using a photolithographic mask and by then etching to remove exposed areas of photoresist and then exposed portions of insulating layer 206.

The act in box 312 deposits semiconductor layer 210. The act in box 312 can deposit heavily n-doped amorphous silicon 62 with 0.5–2% phosphorous and 5–15% hydrogen at 200°–250° C. to a thickness of about 1000 Å. The act in box 312 could also optionally include a preliminary etch to remove some parts of layer 210.

The act in box 314 cuts through layers 202, 204, and 210. Within array circuitry 104, the act in box 312 can etch down to islands over channels in layer 206 and down to layer 202 where appropriate for isolation. The act in box 312 can, in a separate operation, etch through layers 210, 204, and 202 to expose part of lower contact pad 250. The act in box 314 can also expose appropriate parts of the capacitor lines to allow connection with ground pads 106.

The act in box 316 produces the second patterned conductive layer. The act in box 316 can sputter deposit a thin layer of titanium tungsten to a thickness of approximately 500 Å, followed by a thicker layer of aluminum to a thickness of 4000–5000 Å, and capped by a final layer of titanium tungsten to a thickness of approximately 500–1000 Å. These three metal layers can be sputter deposited in sequence in a chamber without breaking the vacuum between depositions. The act in box 316 can then use photolithographic techniques to mask and then etch the resulting layer, first etching titanium tungsten with $H_2O_2$, followed by a standard aluminum etch, and finally etching titanium tungsten again with $H_2O_2$. After etching, the second patterned conductive layer includes data lines as well as contact leads 150 and 152, electrode 156, and upper contact pad 252. In addition, the second patterned conductive layer connects the capacitor lines with ground pads 106.

The act in box 318 patterns semiconductor layers 204 and 210, leaving them only in areas that are covered by the second patterned conductive layer. Therefore, the act in box 318 can etch with the same mask as the act in box 316, but using a plasma etch of 10:1 $CF_4/O_2$. The act in box 318 thus removes layer 210 from over the channel and gate lead 154.

The act in box 320 produces second insulating layer 220 with an opening to expose part of electrode 156. The act in box 320 can deposit a passivation material such as silicon oxynitride to a thickness of 6000 Å or thicker if necessary to reduce coupling. The act in box 320 can then use photolithographic techniques to mask and then etch the resulting layer to produce an opening exposing part of electrode 156 in each unit of cell circuitry. This and other etches of layer 220 can produce an edge with a tapered profile if the etchant also attacks the photoresist mask.

The act in box 322 produces a patterned layer that forms each unit's conductive element 230. The act in box 322 can deposit ITO using reactive sputter techniques in 0.5–1.5% $O_2$ to a thickness of about 500–1000 Å. The act in box 322 can then use photolithographic techniques to mask and then etch the resulting layer to produce conductive element 230. The act in box 322 can also anneal the conductive elements at a temperature of 200°–230° C. for approximately one hour. As noted above, the mask used in box 322 can preserve spacings of 10 µm between adjacent conductive elements, or any spacing of 3–10 µm that is just sufficient to ensure isolation between adjacent conductive elements.

The act in box 324 cuts through to upper contact pad 252. The act in box 324 can use photolithographic techniques to mask and then etch insulating layer 220 to expose upper contact pad 252.

The act in box 326 coats array circuitry 204 with a layer of x-ray sensitive material. The act in box 326 can be implemented by evaporating an alloy of selenium and arsenic to a thickness of 100–400 µm, using conventional techniques disclosed in U.S. Pat. Nos. 5,320,927 and 4,770, 965, incorporated herein by reference. Or other x-ray sensitive materials such as lead iodide or thallium bromide could be used. The x-ray sensitive material should not be applied to the peripheral circuitry that includes contact pads.

C.3. Results

The structure described above has been successfully implemented in an 1536×1280 x-ray sensor array with a pitch for each unit of cell circuitry between 100–150 µm and with a spacing of approximately 10 µm between conductive elements of adjacent cells.

The implementation eliminated any problem with back channel charging over the TFT. It resulted in a good yield when coated with selenium to produce an x-ray sensor array. The process proved efficient and yielded well.

C.4. Variations

The implementation described above provides thin film circuitry on an insulating substrate. The invention could be implemented with other types of circuitry on other types of substrates.

The implementation described above includes array circuitry with amorphous silicon TFTs, but the array circuitry could include other types of switching elements with channels formed of other materials.

The implementation described above includes a glass substrate, but other substrates could be used, such as quartz.

The implementation described above includes 1536×1280 units of cell circuitry with a pitch for each unit between 100–150 µm, but other array sizes and pitches could be used. For example, the implementation could be used with materials like selenium to produce arrays ranging from 8"×10" high resolution arrays with 50–60 µm units to 14"×18" arrays with 60–100 µm units.

The implementation described above includes layers of specified thicknesses, produced from specified materials by specified processes, but other thicknesses could be produced, and other materials and processes could be used, such as thinner semiconductor and insulating layers to improve TFT performance or to increase storage capacitance. Rather than a-Si, other semiconductor materials could be used in the semiconductor layers, including but not limited to poly-Si, SiGe, CdSe, or a composite layer of poly-Si and SiGe. Similarly, various conductive materials could be used in the scan lines and data lines, including but not limited to Al, ITO, MoTa, Cr, MoCr, Ta, Cu, Ti, TiN, and organic conductive materials. Rather than using selenium as an x-ray sensitive material, lead iodide or thallium bromide could be used.

The implementation described above provides an x-ray sensor array, but the array could sense radiation in other frequency bands. For example, an a-Si photosensitive layer could be deposited over the conductive element, along lines described in copending, coassigned U.S. Patent Application No. 08/483,406, entitled "Improved Solid State Sensor Array," incorporated herein by reference.

The implementation described above provides a sensor array, but the array could provide a reflective display, with the conductive elements including a very reflective metal such as aluminum, silver, or dielectric coated aluminum.

The implementation described above provides a silicon oxynitride insulating layer over a highly conductive metal layer, but other materials, such as silicon oxide or silicon nitride, could be used.

The implementation described above provides a conductive element of ITO, which is appropriate in an x-ray sensor array with a selenium coating because it provides a blocking contact that blocks injection of charge carriers into the selenium coating at high voltages. Further, ITO is transparent, which may be useful in certain applications. But other materials could be used. A refractory metal, such as chromium, titanium, tungsten, or molybdenum, or their alloys, could be used to prevent interaction between the upper capacitor electrode and a semiconductor transducer layer over the conductive elements. As noted above, a reflective metal layer could be used in a reflective display. Or a heavily doped conductive semiconductor layer could be used with a semiconductor transducer layer to block charge injection into the semiconductor transducer layer.

The implementation described above includes layers in a specific sequence, but the sequence of layers could be modified, such as by adding an optional etch of the doped semiconductor layer as noted above.

The implementation described above includes units of cell circuitry laid out in a particular way, but many other layouts could be used, with components arranged differently.

Figure 7:
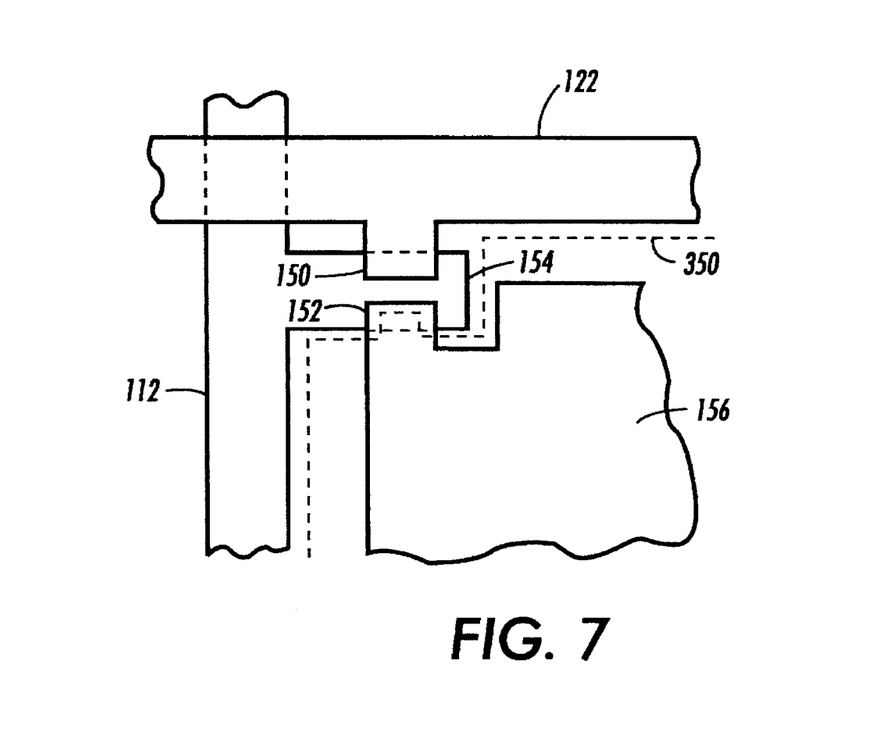
FIG. 7 is a schematic diagram showing an alternative implementation of the layout in FIG. 3.

FIG. 7 shows one variation in layout that could be used to prevent a conductive element from receiving noise from its scan line or data line. The components in FIG. 7 have the same reference numerals as in FIG. 3, with mth scan line 112 joining gate lead 154, with nth data line 122 joining contact lead 150, and with contact lead 152 joining electrode 156.

Dashed line 350 shows the outline of the conductive element. As shown, dashed line 350 is offset from scan line 112 and from data line 122. In addition, dashed line 350 is slightly offset from the outline of gate lead 154 and also from the outline of contact lead 152 such that the conductive element does not extend over the channel, over any part of gate lead 154 that is not covered by contact lead 152, or over any part of contact lead 150.

Offsets like those shown in FIG. 7 may be useful in reducing noise in signals. In particular, for high fidelity, such as to reduce image artifacts below 1% of signal, noise reduction may be an important consideration.

For example, scan line 112 and gate lead 154 experience large voltage swings such as 20V, large enough to generate charge carriers that feed through a passivation layer, which could result in direct injection of charge carriers into a conductive element. If the readout electronics must accommodate too large a fraction of feed-through charge, the dynamic range of sensing could be reduced, and the readout electronics might even be overloaded.

Similarly, data line 122 and contact lead 150 and any overlap of a conductive element with data lines of adjacent units of cell circuitry could produce cross talk because signals of different units could couple capacitively. The thickness of the passivation layer may be inadequate to prevent capacitive coupling.

D. Applications

The invention could be applied in many ways, including arrays for sensors of various bands of radiation and for reflective LCD displays.

A small, high resolution x-ray sensor array could be used for mammographic imaging, while a larger, low resolution x-ray sensor array could be used as a film replacement in other diagnostic radiology applications.

E. Miscellaneous

Although the invention has been described in relation to various implementations, together with modifications, variations, and extensions thereof, other implementations, modifications, variations, and extensions are within the scope of the invention. The invention is therefore not limited by the description contained herein or by the drawings, but only by the claims.

What is claimed is:

1. A product comprising:

a substrate with a surface at which circuitry can be formed;

array circuitry formed at the surface of the substrate, the array circuitry comprising:

N conductive lines extending across the surface of the substrate, where N is an integer greater than one; and along each of the N conductive lines, one or more units of cell circuitry; each unit of cell circuitry comprising:

a switching element; the switching element comprising first and second conductive channel leads, a channel extending between the first and second conductive channel leads, and first and second contact leads; the first and second conductive channel leads and the channel comprising semiconductor material; the first and second contact leads comprising highly conductive metal; the second contact lead being electrically connected to the second conductive channel lead and the first contact lead being electrically connected between the first conductive channel lead and the conductive line so that the channel provides an electrical connection between the second contact lead and the conductive line when the channel is in a conductive state;

a capacitive element having a first electrode, a second electrode, and a capacitor dielectric between the first and second electrodes; the second electrode being electrically connected to the second contact lead; and a conductive element electrically connected to the second electrode;

the array circuitry further comprising:

a first patterned conductive layer that includes the first electrode of each unit of cell circuitry;

a first insulating layer; the capacitor dielectric of each unit of cell circuitry including a part of the first insulating layer; the capacitor dielectric covering the first electrode;

a second patterned conductive layer that comprises highly conductive metal other than indium tin oxide; the second patterned conductive layer including the N conductive lines and the first and second contact leads and the second electrode of each unit of cell circuitry; the second contact lead and the second electrode being joined in the second patterned conductive layer; the second electrode covering the capacitor dielectric;

a second insulating layer that extends over the second electrode of each unit of cell circuitry; the second insulating layer covering the second electrode except in an exposed part of the second electrode; the second insulating layer having an opening defined therein over the exposed part; and a third patterned conductive layer over the second insulating layer; the third patterned conductive layer being a layer of indium tin oxide; the third patterned conductive layer including the conductive element of each unit of cell circuitry; the conductive element extending over the second electrode; the conductive element contacting the exposed part of the second electrode so that the conductive element is electrically connected to the second contact lead through the second electrode.

2. The product of claim 1 in which the second insulating layer further extends over the first and second contact leads and the channel of each unit of cell circuitry; the conductive element of each unit of cell circuitry further extending over the first and second contact leads and the channel of the unit of cell circuitry.

3. The product of claim 1, further comprising:

a transducer element positioned along the conductive element of each unit of cell circuitry along each conductive line for receiving signals from the conductive line through the unit of cell circuitry or for providing signals to the conductive line through the unit of cell circuitry.

4. The product of claim 3 in which the transducer element is for providing signals to the conductive line that indicate electromagnetic radiation.

5. The product of claim 4 in which the transducer element is for providing signals to the conductive line that indicate x-ray radiation.

6. The product of claim 5 in which the transducer element comprises selenium.

7. The product of claim 1 in which the substrate is an insulator.

8. The product of claim 7 in which the substrate is glass.

9. The product of claim 1 in which the highly conductive metal is aluminum.

10. The product of claim 9 in which the second patterned conductive layer further comprises an alloy of titanium and tungsten.

11. The product of claim 1 in which the second patterned conductive layer includes first and second sublayers; the first sublayer including highly conductive metal; the second sublayer including a refractory metal different than the highly conductive metal.

12. The product of claim 1 in which the second insulating layer comprises silicon oxynitride.

13. The product of claim 1 in which the second insulating layer has an edge around the opening defined therein; the edge having a tapered profile.

14. The product of claim 1 in which the first and second conductive channel leads and the channel comprise amorphous silicon.

15. A product comprising:

a substrate with a surface at which circuitry can be formed;

array circuitry formed at the surface of the substrate, the array circuitry comprising:

a set of M scan lines, where M is an integer greater than one; each of the scan lines extending approximately in a first direction across the surface of the substrate;

a set of N data lines, where N is an integer greater than one; each of the N data lines extending approximately in a second direction across the surface of the first substrate; the second direction being different than the first direction so that each of the N data lines crosses each of the M scan lines in a crossing region; and for each combination of an mth one of the M scan lines and an nth one of the N data lines, (m×n)th cell circuitry near the crossing region where the nth data line crosses the mth scan line; the (m×n)th cell circuitry being connected for receiving signals from the mth scan line and for receiving signals from or providing signals to the nth data line; the mth and (m+1)th ones of the scan lines and the nth and (n+1)th ones of the data lines bounding a cell area; the (m×n)th cell circuitry comprising:

a switching element; the switching element comprising first and second conductive channel leads, a channel extending between the first and second conductive channel leads, first and second contact leads, and a gate lead; the first and second conductive channel leads and the channel comprising semiconductor material; the first and second contact leads and the gate lead comprising highly conductive metal; the gate lead being positioned along the channel and being electrically connected to the mth scan line so that a signal on the mth scan line controls conductivity of the channel; the second contact lead being electrically connected to the second conductive channel lead and the first contact lead being electrically connected between the first conductive channel lead and the nth data line so that the channel provides an electrical connection between the second contact lead and the nth data line when the channel is in a conductive state;

a capacitive element having a first electrode, a second electrode, and a capacitor dielectric between the first and second electrodes; the second electrode being electrically connected to the second contact lead; and a conductive element electrically connected to the second electrode;

the array circuitry further comprising:

a first patterned conductive layer that comprises highly conductive metal; the first patterned conductive layer including the M scan lines and the gate lead and the first electrode of each unit of cell circuitry; the gate lead of the (m×n)th cell circuitry and the mth scan line being joined in the first patterned conductive layer;

a first insulating layer; the capacitor dielectric of each unit of cell circuitry including a part of the first insulating layer; the capacitor dielectric covering the first electrode;

a second patterned conductive layer that comprises highly conductive metal; the second patterned conductive layer including the N data lines and the first and second contact leads and the second electrode of each unit of cell circuitry; the first contact lead of the (m×n)th cell circuitry and the nth data line being joined in the second patterned conductive layer; the second contact lead and the second electrode being joined in the second patterned conductive layer; the second electrode covering the capacitor dielectric;

a second insulating layer that extends over the second electrode of each unit of cell circuitry; the second insulating layer covering the second electrode except in an exposed part of the second electrode; the second insulating layer having an opening defined therein over the exposed part; and a third patterned conductive layer over the second insulating layer; the third patterned conductive layer including the conductive element of each unit of cell circuitry; the conductive element extending over the the second electrode; the conductive element contacting the exposed part of the second electrode so that the conductive element is electrically connected to the second contact lead through the second electrode;

mth and (m+1)th ones of the M scan lines and nth and (n+1)th ones of the N data lines bounding a cell area; the conductive element of the (m×n)th unit of cell circuitry extending beyond the cell area to overlap the mth scan line; the conductive element of the (m×n)th unit of cell circuitry being aligned with but not overlapping the nth and the (n+1)th data lines; the conductive element of the (m×n)th unit of cell circuitry being spaced from the (m+1)th scan line.

16. A product comprising:

a substrate with a surface at which circuitry can be formed;

array circuitry formed at the surface of the substrate, the array circuitry comprising:

a set of M scan lines, where M is an integer greater than one; each of the scan lines extending approximately in a first direction across the surface of the substrate;

a set of N data lines, where N is an integer greater than one; each of the N data lines extending approximately in a second direction across the surface of the first substrate; the second direction being different than the first direction so that each of the N data lines crosses each of the M scan lines in a crossing region; and for each combination of an mth one of the M scan lines and an nth one of the N data lines, (m×n)th cell circuitry near the crossing region where the nth data line crosses the mth scan line; the (m×n)th cell circuitry being connected for receiving signals from the mth scan line and for receiving signals from or providing signals to the nth data line; the mth and (m+1)th ones of the scan lines and the nth and (n+1)th ones of the data lines bounding a cell area; the (m×n)th cell circuitry comprising:

switching element; the switching element comprising first and second conductive channel leads, a channel extending between the first and second conductive channel leads, first and second contact leads, and a gate lead; the first and second conductive channel leads and the channel comprising semiconductor material; the first and second contact leads and the gate lead comprising highly conductive metal; the gate lead being positioned along the channel and being electrically connected to the mth scan line so that a signal on the mth scan line controls conductivity of the channel; the second contact lead being electrically connected to the second conductive channel lead and the first contact lead being electrically connected between the first conductive channel lead and the nth data line so that the channel provides an electrical connection between the second contact lead and the nth data line when the channel is in a conductive state;

a capacitive element having a first electrode, a second electrode, and a capacitor dielectric between the first and second electrodes; the second electrode being electrically connected to the second contact lead; and a conductive element electrically connected to the second electrode;

the array circuitry further comprising:

a first patterned conductive layer that comprises highly conductive metal; the first patterned conductive layer including the M scan lines and the gate lead and the first electrode of each unit of cell circuitry; the gate lead of the (m×n)th cell circuitry and the mth scan line being joined in the first patterned conductive layer;

a first insulating layer; the capacitor dielectric of each unit of cell circuitry including a part of the first insulating layer; the capacitor dielectric covering the first electrode;

a second patterned conductive layer that comprises highly conductive metal other than indium tin oxide; the second patterned conductive layer including the N data lines and the first and second contact leads and the second electrode of each unit of cell circuitry; the first contact lead of the (m×n)th cell circuitry and the nth data line being joined in the second patterned conductive layer; the second contact lead and the second electrode being joined in the second patterned conductive layer;

the second electrode covering the capacitor dielectric;

a second insulating layer that extends over the second electrode of each unit of cell circuitry; the second insulating layer covering the second electrode except in an exposed part of the second electrode; the second insulating layer having an opening defined therein over the exposed part; and a third patterned conductive layer over the second insulating layer; the third patterned conductive layer being a layer of indium tin oxide; the third patterned conductive layer including the conductive element of each unit of cell circuitry; the conductive element extending over the the second electrode; the conductive element contacting the exposed part of the second electrode so that the conductive element is electrically connected to the second contact lead through the second electrode.

17. The product of claim 16 in which the first and second directions are perpendicular.

18. The product of claim 16 in which the array circuitry defines a two-dimensional array.

19. The product of claim 16 in which mth and (m+1)th ones of the M scan lines and nth and (n+1)th ones of the N data lines bound a cell area; the conductive element of the (m×n)th unit of cell circuitry extending beyond the cell area to overlap the mth scan line.

20. The product of claim 19 in which the conductive element of the (m×n)th unit of cell circuitry is separated from the conductive element of an adjacent unit of cell circuitry by a spacing just sufficient for electrical isolation.

21. The product of claim 20 in which the second insulating layer is sufficiently thick that coupling between the conductive element and the mth scan line does not significantly slow propagation of signals on the mth scan line.

22. The product of claim 16 in which mth and (m+1)th ones of the M scan lines and nth and (n+1)th ones of the N data lines bound a cell area; the conductive element of the (m×n)th unit of cell circuitry being offset inward from cell area's boundary sufficiently to avoid receiving noise caused by signals on the mth and (m+1)th scan lines and nth and (n+1)th data lines.

23. An x-ray sensor comprising:

a substrate with a surface at which circuitry can be formed;

array circuitry formed at the surface of the substrate, the array circuitry comprising:

N conductive lines extending across the surface of the substrate, where N is an integer greater than one; and along each of the N conductive lines, one or more units of cell circuitry; each unit of cell circuitry comprising:

a switching element; the switching element comprising first and second conductive channel leads, a channel extending between the first and second conductive channel leads, and first and second contact leads; the first and second conductive channel leads and the channel comprising semiconductor material; the first and second contact leads comprising highly conductive metal; the second contact lead being electrically connected to the second conductive channel lead and the first contact lead being electrically connected between the first conductive channel lead and the conductive line so that the channel provides an electrical connection between the second contact lead and the conductive line when the channel is in a conductive state;

a capacitive element having a first electrode, a second electrode, and a capacitor dielectric between the first and second electrodes; the second electrode being electrically connected to the second contact lead; and a conductive element electrically connected to the second electrode;

the array circuitry further comprising:

a first patterned conductive layer that includes the first electrode of each unit of cell circuitry;

a first insulating layer; the capacitor dielectric of each unit of cell circuitry including a part of the first insulating layer; the capacitor dielectric covering the first electrode;

a second patterned conductive layer that comprises highly conductive metal other than indium tin oxide; the second patterned conductive layer including the N conductive lines and the first and second contact leads and the second electrode of each unit of cell circuitry; the second contact lead and the second electrode being joined in the second patterned conductive layer; the second electrode covering the capacitor dielectric;

a second insulating layer that extends over the first and second contact leads, the channel, and the second electrode of each unit of cell circuitry; the second insulating layer covering the second electrode except in an exposed part of the second electrode; the second insulating layer having an opening defined therein over the exposed part; and a third patterned conductive layer over the second insulating layer; the third patterned conductive layer being a layer of indium tin oxide; the third patterned conductive layer including the conductive element of each unit of cell circuitry; the conductive element extending over the first and second conductive channel leads, the channel, and the second electrode; the conductive element contacting the exposed part of the second electrode so that the conductive element is electrically connected to the second contact lead through the second electrode; and an x-ray sensitive material covering the conductive elements of the units of cell circuitry; the x-ray sensitive material producing charge carriers in response to x-ray radiation so that the conductive element of each unit of cell circuitry receives a quantity of charge carriers from a region of the x-ray sensitive material indicating intensity of x-ray radiation received by the region.

24. The x-ray sensor of claim 21 in which the x-ray sensitive material comprises selenium.

25. A product comprising:

a substrate with a surface at which circuitry can be formed;

array circuitry formed at the surface of the substrate, the array circuitry comprising:

N conductive lines extending across the surface of the substrate, where N is an integer greater than one; and along each of the N conductive lines, one or more units of cell circuitry; each unit of cell circuitry comprising:

a switching element; the switching element comprising first and second conductive channel leads, a channel extending between the first and second conductive channel leads, and first and second contact leads; the first and second conductive channel leads and the channel comprising semiconductor material; the first and second contact leads comprising highly conductive metal; the second contact lead being electrically connected to the second conductive channel lead and the first contact lead being electrically connected between the first conductive channel lead and the conductive line so that the channel provides an electrical connection between the second contact lead and the conductive line when the channel is in a conductive state;

a capacitive element having a first electrode, a second electrode, and a capacitor dielectric between the first and second electrodes; the second electrode being electrically connected to the second contact lead; and a conductive element electrically connected to the second electrode;

the array circuitry further comprising:

a first patterned conductive layer that includes the first electrode of each unit of cell circuitry;

a first insulating layer;

a first semiconductor layer that includes the channel of each unit of cell circuitry;

a second semiconductor layer that includes the first and second conductive channel leads of each unit of cell circuitry;

a second patterned conductive layer that comprises highly conductive metal; the second patterned conductive layer including the N conductive lines and the first and second contact leads and the second electrode of each unit of cell circuitry; the second contact lead and the second electrode being joined in the second patterned conductive layer; the second electrode covering the capacitor dielectric;

a second insulating layer that extends over the second electrode of each unit of cell circuitry; the second insulating layer covering the second electrode except in an exposed part of the second electrode; the second insulating layer having an opening defined therein over the exposed part; and a third patterned conductive layer over the second insulating layer; the third patterned conductive layer including the conductive element of each unit of cell circuitry; the conductive element extending over the second electrode; the conductive element contacting the exposed part of the second electrode so that the conductive element is electrically connected to the second contact lead through the second electrode;

the first insulating layer including a part that is over the first electrode of each unit of cell circuitry; the capacitor dielectric of each unit of cell circuitry including the part of the first insulating layer; the first semiconductor layer extending from the channel to include a part that is over the part of the first insulating layer; the second semiconductor layer extending from the second conductive channel lead to include a part that is over the part of the first semiconductor layer; the second electrode being over the part of the second semiconductor layer.

26. The product of claim 25 in which the third patterned conductive layer comprises indium tin oxide.

* * * * *

(12) EX PARTE REEXAMINATION CERTIFICATE (9154th)
United States Patent
Weisfield et al.

(10) Number: US 5,648,674 C1
(45) Certificate Issued: Jul. 31, 2012

(54) ARRAY CIRCUITRY WITH CONDUCTIVE LINES, CONTACT LEADS, AND STORAGE CAPACITOR ELECTRODE ALL FORMED IN LAYER THAT INCLUDES HIGHLY CONDUCTIVE METAL

(75) Inventors: Richard L. Weisfield, Los Altos, CA (US); Nizar S. Kheraj, San Jose, CA (US); Mai T. Nguyen, Palo Alto, CA (US)

(73) Assignee: Thomson Licensing, Boulogne-Billancourt (FR)

Reexamination Request:
No. 90/010,956, May 25, 2010

Reexamination Certificate for:
Patent No.: 5,648,674
Issued: Jul. 15, 1997
Appl. No.: 08/474,845
Filed: Jun. 7, 1995

(51) Int. Cl.
*H01L 31/119* (2006.01)
*H01L 31/0224* (2006.01)
*G01T 1/24* (2006.01)

(52) U.S. Cl. .............. 257/428; 257/59; 257/72
(58) Field of Classification Search .......... None
See application file for complete search history.

(56) References Cited

To view the complete listing of prior art documents cited during the proceeding for Reexamination Control Number 90/010,956, please refer to the USPTO's public Patent Application Information Retrieval (PAIR) system under the Display References tab.

*Primary Examiner* — Tuan H Nguyen (57) ABSTRACT

A product such as an x-ray sensor array includes, for each unit of cell circuitry, a capacitor with upper and lower electrodes. A conductive layer that includes highly conductive metal such as aluminum is patterned to include the upper electrode of the capacitor, the contact leads of a switching element, and the data lines of the array. The upper electrode has an exposed area due to an opening in an insulating layer over it. A conductive element, such as an ITO island, is formed over the insulating layer, contacting the exposed area of the upper electrode so that the conductive element is electrically connected to one of the contact leads of the switching element through the upper electrode. The conductive elements of adjacent units can be separated by the minimum spacing necessary to ensure isolation. Or each unit's conductive element can be offset slightly from the data and scan lines and can also be pulled back from the channel of the switching element, which can be a TFT.

EX PARTE REEXAMINATION CERTIFICATE ISSUED UNDER 35 U.S.C. 307

NO AMENDMENTS HAVE BEEN MADE TO THE PATENT

AS A RESULT OF REEXAMINATION, IT HAS BEEN DETERMINED THAT:

The patentability of claims 1, 2, 7-17 and 19-26 is confirmed.

Claims 3-6 and 18 were not reexamined.

* * * * *